United States Patent [19]

Hogge, Jr.

[11] Patent Number: 4,555,789
[45] Date of Patent: Nov. 26, 1985

[54] EQUALIZER CIRCUIT SUITABLE FOR ADAPTIVE USE WITH FIBER OPTICS

[75] Inventor: Charles R. Hogge, Jr., Richardson, Tex.

[73] Assignee: Rockwell International Corporation, El Segundo, Calif.

[21] Appl. No.: 517,318

[22] Filed: Jul. 26, 1983

[51] Int. Cl.⁴ .......................... H03K 5/08; H04B 3/14
[52] U.S. Cl. ...................................... 375/11; 307/363; 375/14; 375/76; 455/619
[58] Field of Search ............... 375/75, 76, 94, 11, 375/14; 307/362, 363, 364; 328/108, 119; 329/104, 108; 455/619; 333/18

[56] References Cited

U.S. PATENT DOCUMENTS 3,716,780  2/1973  Van Elk et al. .................... 329/104
3,828,204  8/1974  Farnsworth ....................... 307/363
4,326,169  4/1982  Fenderson et al. ................. 375/76

Primary Examiner—Joseph A. Orsino, Jr.
Attorney, Agent, or Firm—V. Lawrence Sewell; Howard R. Greenberg; H. Fredrick Hamann

[57] ABSTRACT

An equalizer circuit wherein the equalized signal is at the output of a summing network; one input to the summing network is the signal to be equalized, and the other input is from a feedback network. The output of the summing network serves as an input to a variable gain unclocked decision device which provides a digital input to the feedback network, depending on whether the equalized signal is determined to be a one or a zero. Sucessful equalization is provided, with the unclocked device. Moreover, the variable gain of the decision device permits the equalizer circuit to respond to a control level from an adaptive control network for automatically equalizing individual transmission links.

2 Claims, 1 Drawing Figure

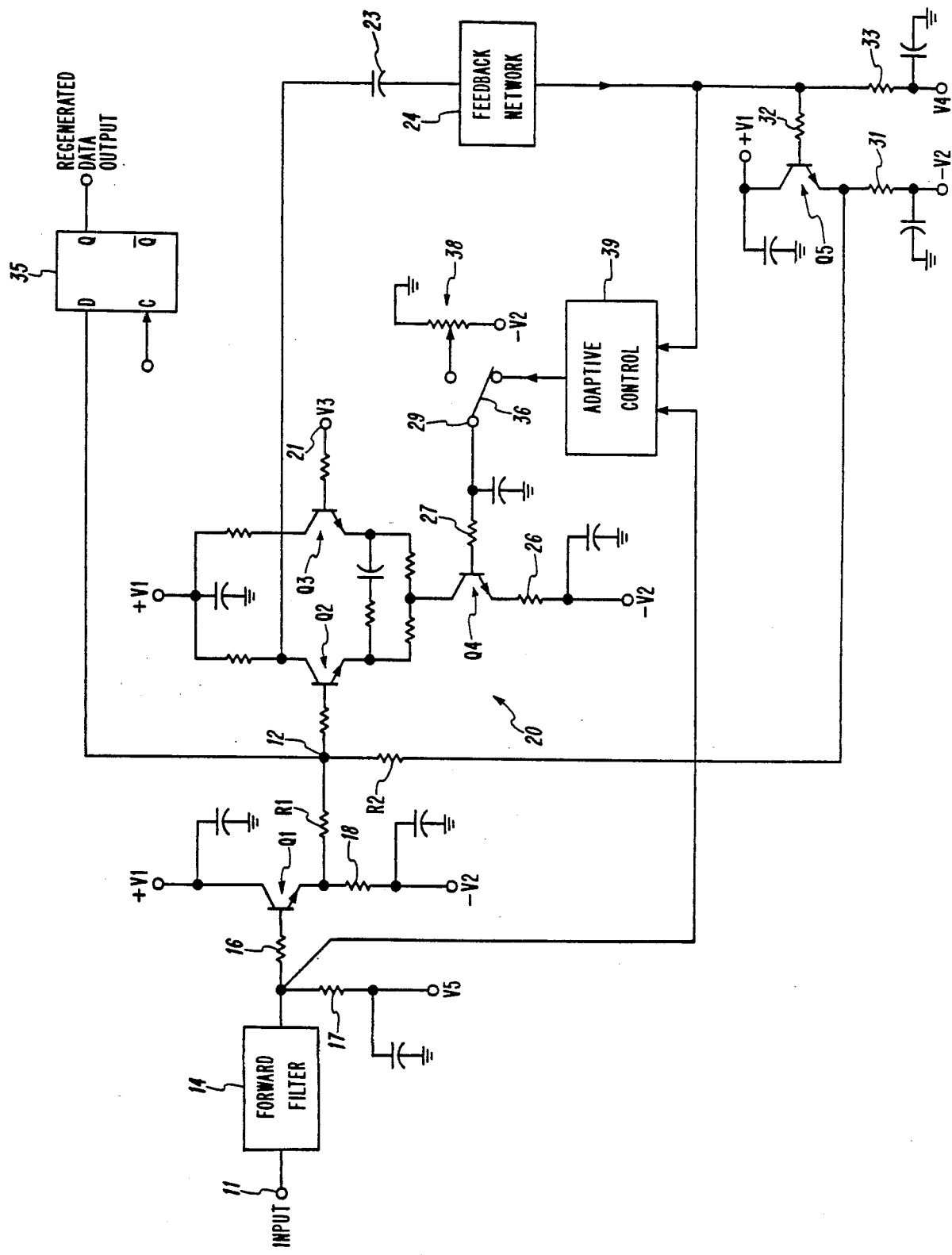

4,555,789

EQUALIZER CIRCUIT SUITABLE FOR ADAPTIVE USE WITH FIBER OPTICS

BACKGROUND OF THE INVENTION

This invention relates to an equalizer circuit of the kind used at the receiving end of a fiber optic system or other digital transmission system to remove distortion introduced by the transmission medium. In particular, the circuit of the present invention is suitable for use in an adaptive equalizer, as well as a manual one.

In digital transmission systems, filtering actions of the transmission medium cause distortion of the transmitted digital pulses such that pulses at the receiver may be spread over more than one baud interval. This intersymbol interference causes the "eye" opening exhibited by pulses at the receiver to close, beginnning in the corners and progressing toward the center. The decision as to whether received data is a one or a zero can be made at the center of the baud interval, but as this portion of the eye begins to close, receiver sensitivity is reduced. It is the role of an equalizer to reduce intersymbol interference as much as possible so as to restore the receiver sensitivity.

In fiber optic systems, not all fibers produce exactly the same filtering of the transmitted pulses. Accordingly, it is desirable to provide an adaptive equalizer which automatically adjusts its equalization to an individual fiber.

SUMMARY OF THE INVENTION

The present invention provides an equalizer circuit wherein the equalized signal is at the output of a summing network. One input to the summing network is the signal to be equalized, and the other input is from a feedback network. The output of the summing network serves as an input to an unclocked decision device. The decision device makes an estimate of whether the equalized signal is a one or a zero and provides a corresponding digital output, which is applied as an input to the feedback network. The feedback network uses the digital input to derive a correction signal to be applied to the signal to be equalized, so as to reduce intersymbol interference.

The unclocked decision device, which can be a differential amplifier with one input biased at a threshold level, has associated with it a gain control which controls the magnitude of the digital output of the decision device in response to a level applied at a control input. The magnitude of the digital output establishes the amount of equalization applied to a particular transmission link, such as a particular optical fiber.

Accordingly, it is an advantage of the present invention that the control input level associated with the decision device can be used to receive a signal from an adaptive control, so as to automatically set the degree of equalization.

An additional advantage of the invention is that the decision device does not use a clocking input; instead, it switches to provide its digital output, at any time in the baud period, based on the comparison of the summing network output to threshold. This has particular advantage at high data rates, as will be described in more detail below.

BRIEF DESCRIPTION OF THE DRAWING

The sole FIGURE shows a schematic diagram of an equalizer circuit according to the invention.

DESCRIPTION OF PREFERRED EMBODIMENT

The FIGURE illustrates a schematic diagram of an equalizer circuit according to the invention. A received baseband signal is applied at input 11, and the equalized output signal is taken from summing point 12.

The signal at input 11 is filtered by forward filter 14, which determines the noise bandwidth of the circuit. The filter is properly terminated by resistor 17. The output of the filter 14 is coupled by transistor Q1 to a summing network comprising resistors R1 and R2. The coupling circuit comprised of transistor Q1 and associated resistors 16, 17 and 18 isolates filter 14 from the summing circuit.

Summing point 12 is connected to one input of a differential amplifier 20 comprised of transistors Q2 and Q3, with an associated gain control including transistor Q4. The design of such a variable gain differential amplifier is conventional and well known in the art. At the other differential input 21 of amplifier 20, is a bias voltage V3 for setting a comparison threshold. When the voltage at summing point 12 exceeds the threshold, transistor Q2 switches on, and transistor Q3 switches off. When the voltage at summing point 12 goes below the threshold, transistor Q2 switches off and transistor Q3 switches on. The resultant digital output at the collector of transistor Q2 is coupled by capacitor 23 to feedback network 24.

The circuit comprised of transistor Q4 and its resistors 26 and 27 serves as a controllable current sink for DC current flowing through transistors Q2 and Q3. As such, a level applied to control input 29 of the transistor Q4 circuit controls the magnitude of the digital output coupled by capacitor 23 from the differential amplifier to the feedback network 24.

The particular design of feedback network 24 is not critical to the invention. It can be of any design known to provide appropriate digital equalization feedback. The output of feedback network 24 is coupled by the circuit including transistor Q5 and resistors 31-33 to resistor R2 of the summing circuit.

Flip-flop 35 responds to the equalized digital signal at summing point 12 to provide a clocked regenerated data output. The flip-flop and differential amplifier 20 can be set to the same one-zero decision level, if the threshold associated with the D input of flip-flop 35 is substantially the same as that established by bias V3 of differential amplifier 20.

The general operation of the equalizer circuit is as follows. Feedback network 24 supplies to summing resistor R2 a voltage which when summed with the signal to be equalized, at resistor R1, produces at summing point 12 an equalized signal in which the effects of interpulse interference have been substantially reduced. Feedback network 24 requires, in order to provide the proper equalizing voltage, a well-formed digital input which is an estimate of the signal at summing point 12. Operational amplifier 20 provides such an input for feedback network 24.

It can be understood that the magnitude of the digital output of differential amplifier 20 influences the amount of equalization applied by feedback network 24 to the summing network of resistors R1 and R2. Thus, a voltage level applied at control input 29 can be used to establish the amount of equalization applied by the circuit. When control input 29 is connected by a switch 36 to variable biasing network 38, the variable bias can be manually adjusted to provide the amount of equalization appropriate to a particular transmission medium, such as a particular optical fiber. Switch 39 can also connect terminal 29 to an adaptive control network 39. Suitable input connections for adaptive control 39 are, as shown in the FIGURE, the output of forward filter 14 and that of feedback network 24. Then adaptive control 39 could supply a level to control input 29 for automatically setting an amount of equalization appropriate to, say, a particular optical fiber.

It is an advantage of the present invention that control input 29 is provided to receive a voltage level, which not only can be used for manual adjustment of equalization, but is also completely suitable for use with an adaptive control.

It is another advantage of the invention that equalization is provided employing an unclocked decision device, namely variable gain differential amplifier 20. The operation of amplifier 20 is such that it can switch states at any time, throughout the baud interval, dependent only upon the comparison of the output of summing point 12 with the threshold bias V3. Its switching does not await the occurrence of a clocking input. This is particularly advantageous at high data rates. One factor is that clocked decision devices typically introduce about one-half bit processing delay, which can impose difficult or impossible design constraints on a feedback circuit such as that described herein. Further, the use of a clocked decision device requires that the device operate at the incoming data rate and that a clock signal be successfully recovered at that rate. These conditions are not necessarily required by the present invention. For example, if the incoming data at input 11 is made up of N multiplexed data streams, then these data streams can be regenerated by N flip-flops like flip-flop 35, each appropriately clocked at a rate 1/N times the incoming data rate. Under these circumstances, no clock signal or clocked decision making is required at the incoming data rate.

Thus, the present invention provides an equalizer circuit suitable for adaptive as well as manual control and capable of providing equalization using an unclocked decision device.

I claim:

1. An equalizer circuit suitable for adaptive or manual control of the equalization of a circuit input signal having digital pulses exhibiting distortion, comprising:
    means for providing a waveform which is the sum of signals at first and second summing inputs thereof;
    means capable of responding to said circuit input signal to be equalized, for coupling it to the first of said summing inputs;
    decision means for providing a first digital state output when said sum waveform assumes a value selected to correspond to a logic one and second digital state output when said sum waveform assumes a value selected to correspond to a logic zero, by responding to a comparison of said sum waveform and a threshold, switching to provide said digital state outputs, at any time, based on said comparison, without the requirement of a clocking input;
    gain control means, associated with said decision means, responsive to a control input level for controlling the magnitude of said digital state output so that said control input level can be adaptively or manually varied to achieve a change in equalization; and
    means for processing said digital state outputs to provide an equalizing waveform to said second summing input for combination with the pulses of the circuit input signal to correct said distortion of the pulses.

2. An equalizer circuit suitable for adaptive or manual control of the equalization of a circuit input signal having digital pulses exhibiting distortion, comprising.
    means, including first and second resistors, for providing a waveform which is the sum of signals applied at first and second terminals of said first and second resistors, respectively;
    means capable of responding to said circuit input signal to be equalized, for coupling it to said first resistor terminal;
    means for providing a first digital state output when said sum waveform assumes a value selected to correspond to a logic one and a second digital state output when said sum waveform assumes a value selected to correspond to a logic zero, including a variable gain differential amplifier having first and second differential inputs and a gain control input, with said first differential input responsive to said sum waveform and said second differential input connected to a threshold bias, so that in response to a comparison of said sum waveform and the threshold represented by said bias, said differential amplifier switches to provide said digital state outputs, at any time, based on said comparison, without the requirement of a clocking input, and so that a level applied to said gain control input controls the magnitude of said digital state output so that said control input level can be adaptively or manually varied to achieve a change in equalization; and
    means for processing said digital state outputs to provide an equalizing waveform to said second resistor terminal for combination with the pulses of the circuit input signal to correct said distortion of the pulses.

* * * * *